United States Patent [19]
Mikami

[11] Patent Number: 6,102,210
[45] Date of Patent: Aug. 15, 2000

[54] CARRIER TAPE FOR ELECTRONIC COMPONENTS

[75] Inventor: Shinichi Mikami, Tokyo, Japan

[73] Assignee: Sumitomo Bakelite Company Limited, Tokyo, Japan

[21] Appl. No.: 09/167,549

[22] Filed: Oct. 7, 1998

[30] Foreign Application Priority Data

Oct. 27, 1997 [JP] Japan ................................ 9-294148

[51] Int. Cl.$^7$ .................................................. B65D 85/30
[52] U.S. Cl. ............................................ 206/714; 206/725
[58] Field of Search ................................. 206/713, 714, 206/718, 722–725, 521, 586, 591, 592, 486, 488, 328–332

[56] References Cited

U.S. PATENT DOCUMENTS

| | | | |
|---|---|---|---|
| 5,064,063 | 11/1991 | Manca et al. ............................ | 206/722 |
| 5,076,427 | 12/1991 | Thomson et al. . | |
| 5,351,821 | 10/1994 | Skrtic . | |
| 5,524,765 | 6/1996 | Gutentag . | |

FOREIGN PATENT DOCUMENTS

| | | | |
|---|---|---|---|
| 2258573 | 10/1990 | Japan ..................................... | 206/330 |
| 4128153 | 4/1992 | Japan ..................................... | 206/330 |
| 5178383 | 7/1993 | Japan ..................................... | 206/330 |
| 8-198317 | 8/1996 | Japan . | |
| 9-124092 | 5/1997 | Japan . | |
| 92 14348 | 8/1992 | WIPO . | |

OTHER PUBLICATIONS

Patent Abstracts of Japan, vol. 097, No. 007, Jul. 31, 1997, JP 09 066964.

Patent Abstracts of Japan, vol. 095, No. 009, Oct. 31, 1995, JP 07 149393, Jun. 13, 1995.

*Primary Examiner*—Paul T. Sewell
*Assistant Examiner*—Luan K. Bui
*Attorney, Agent, or Firm*—Smith Gambrell & Russell, LLP

[57] ABSTRACT

The present invention provides a carrier tape for electronic components comprising a flexible tape material having embossed portions for storing electronic components at regular intervals in the lengthwise direction of the tape, characterized in that each of the opposing first and third side walls of the embossed portion which are positioned at both sides of the lengthwise direction of the tape, has a pair of first protrusions A for preventing the electronic component from transverse shaking which protrude inwardly in the embossed portion, and optionally further has, between the protrusions A, a plurality of second protrusions B for preventing the electronic component from longitudinal shaking which differ in shape from the protrusions A. According to one preferred embodiment of the present invention, the carrier tape for electronic components has, at the bottom surface of the embossed portion, two or more central protuberances in the direction perpendicular to the lengthwise direction of the carrier tape. The carrier tape of the present invention prevents rupture of the electronic components caused by vibrations or trembles of the electronic components during transportation and, furthermore, improves inspection ability at optical inspection at the time of insertion of the electronic components and thus further improves productivity.

4 Claims, 10 Drawing Sheets

CARRIER TAPE FOR ELECTRONIC COMPONENTS

The present invention relates to an article for packaging and carrying components, particularly, to a carrier tape for electronic components which is used for packaging and carrying electronic components such as IC.

Hitherto, carrier tapes as shown in FIG. 9 have been known as such tapes. The carrier tape 1 is made of a flexible resin material and comprises two portions of a recess 2 (hereinafter referred to as "embossed portion 2"). and a flange portion 3. A plurality of the embossed portions 2 are arranged at equal spaces along the length of the carrier tape 1 (in the lengthwise direction of the tape) and are used for storing one electronic component in one embossed portion. The flange portion 3 is used for allowing a tape-like cover (hereinafter referred to as "cover tape") to adhere thereto so that the electronic components stored do not fall off from the openings of the embossed portions during transportation of the components, and has a number of perforations arranged at equal spaces on both or one side of the tape in the lengthwise direction.

The carrier tape 1 used for packaging and carrying electronic components is intermittently fed at an interval of the distance between the embossed portions 2 at the time of insertion of electronic components into the embossed portions 2, inspection of the electronic components or adhering of the cover tape as shown in FIGS. 10 and 11. In this intermittent feeding, the electronic components inserted in the embossed portions 2 move in horizontal direction together with the carrier tape 1, and when it stops at the position for inspection of the electronic components, the position varies at every feeding to cause miss-recognition or miss-operation of the inspection device. Furthermore, when the carrier tape 1 is stopped, sometimes the electronic component in the embossed portion is pressed against the wall surface in the moving direction by the inertia action of the electronic component's own weight and stops in the state of the lead part of the electronic component contacting with the wall surface. This state causes severe miss-operation or miss-recognition by the inspection device which utilizes a reflected light of an optical illuminator, because the reflected light from the lead and the reflected light from the wall surface are banded together and indistinguishable.

Moreover, after insertion and inspection of the electronic components and adhesion of the cover tape, the carrier tape 1 is wound on reel 5 and then is transported. During the transportation, the reel 5 storing the electronic components may receive various unexpected external forces such as a shock caused by unexpected dropping, and a vibration and shock caused by movement. Owing to the shock and vibration, the electronic component comes to contact with the wall surface and the bottom surface of the embossed portion 2 of the carrier tape 1, which sometimes leads to contamination or distortion of the lead part. In addition, in the case of the embossed portion 2 having the shape as shown in FIG. 9 which illustrates the conventional carrier tape, unexpected shock causes distortion of the embossed portion 2, which leads to distortion or rupture of the lead part of the electronic component.

Furthermore, generally, the carrier tape 1 is made from a flexible resin material (sheet-like material) and thereafter the embossed portions 2 are formed. In the molding of the embossed portions 2, the residual stress generated at the time of molding is concentrated at the corners of the embossed portions, resulting in a phenomenon of distortion of the flange portion 3 in the form of protuberance. This distortion in the form of protuberance exerts a bad influence of increase in scatter of peel strength when the cover tape is peeled off for taking out the electronic components from the carrier tape 1. As a result, the peeling speed of the cover tape cannot be enhanced and breakage of the cover tape is brought about or the carrier tape 1 is shaken above the surface mounting apparatus. This is not preferred for the improvement of mounting efficiency of electronic components.

In view of the above problems, the present invention provides a carrier tape for electronic components according to which vibration and shake of the electronic components in the embossed portions are diminished and scatter in peel strength of the cover tape is decreased.

The present invention relates to a carrier tape for electronic components having embossed portions for storing electronic components which are arranged at regular intervals in the lengthwise direction of the tape, wherein the opposing first and third side walls positioned on both sides of the embossed portion in the lengthwise direction of the tape, respectively have a pair of first protrusions A for preventing the electronic component from transverse shaking and, if necessary, a plurality of second protrusions B different in shape from the protrusions A are provided between the pair of the protrusions A for preventing the electronic component from longitudinal shaking. According to one preferred embodiment of the present invention, the distance between the pair of the protrusions A ("A—A" in FIG. 4) is larger by 0.05–0.5 mm than the length of the electronic component in the length-wise direction of the carrier tape, said distance between the pair of the protrusions A being measured at the position thereof apart by the distance of ½ ("e" in FIG. 4) of the length of the electronic component in the direction perpendicular to the lengthwise direction of the tape from the center of the embossed portion, and the wall surface forming the protrusions A which prevent transverse shaking of the electronic component, forms an angle of 3–45° with the direction perpendicular to the lengthwise direction of the tape, and besides, the distance between the tops of the protrusions A in the direction perpendicular to the lengthwise direction of the tape ("At—At" in FIG. 4) is larger by 0.05–2 mm than the distance between the outermost sides of the lead part of the electronic component ("Y" in FIG. 4). According to another preferred embodiment of the present invention, the difference between the shortest distance between two protrusions B in the direction perpendicular to the lengthwise direction of the carrier tape and the length of the electronic component in the direction perpendicular to the lengthwise direction of the tape is 0.1–1 mm ("B–E" in FIG. 8) and is smaller than the difference ("(At—At)—Y") between the distance between the tops of the protrusions A in the direction perpendicular to the lengthwise direction of the tape ("At—At" in FIG. 4) and the distance between the outermost sides of the lead part of the electronic component ("Y" in FIG. 4). According to further another preferred embodiment of the present invention, the bottom surface forming the embossed portion has two or more central protuberances in the direction perpendicular to the lengthwise direction of the carrier tape.

Figure 12:
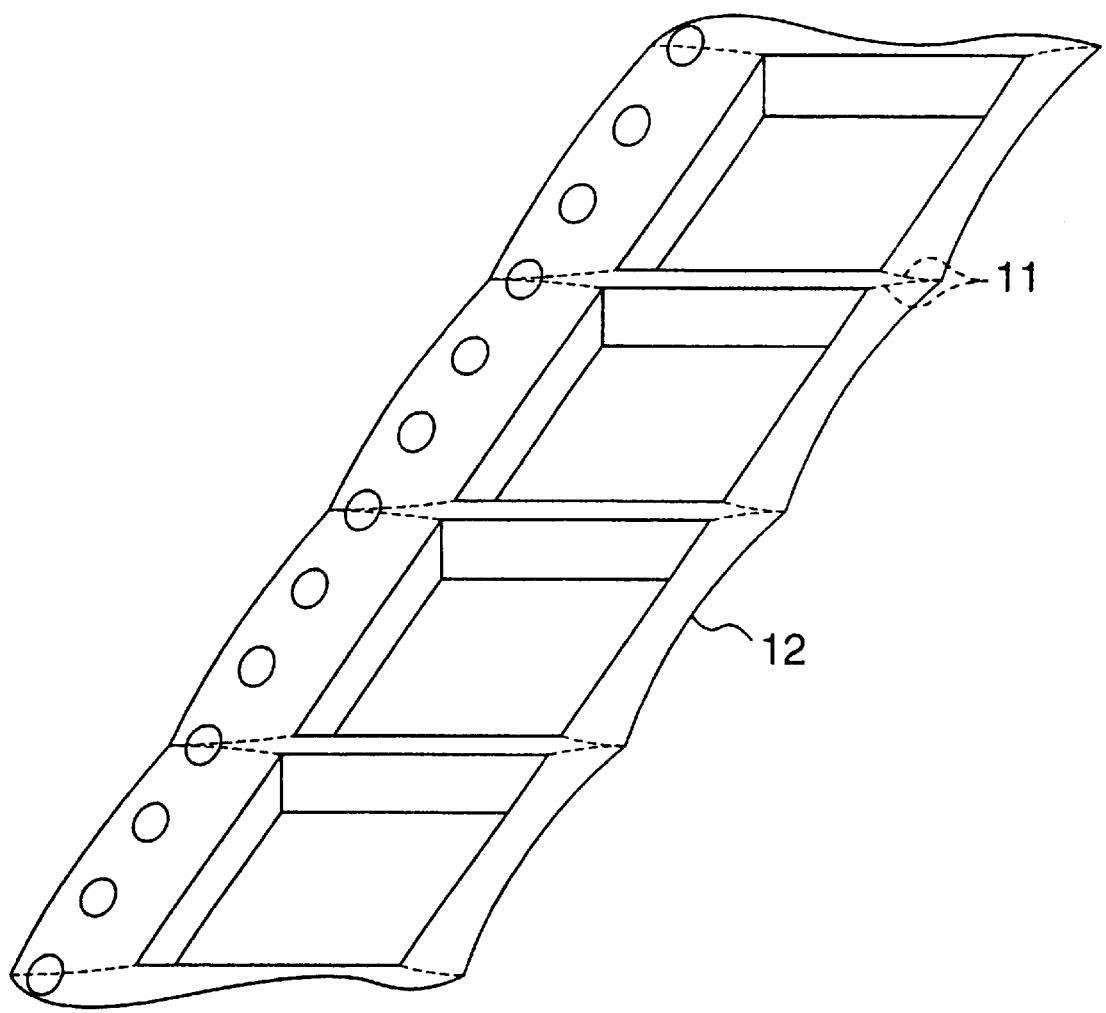

FIG. 12 schematically shows residual stress at molding and waving phenomenon of the flange portion in the conventional carrier tape.

Figure 13:
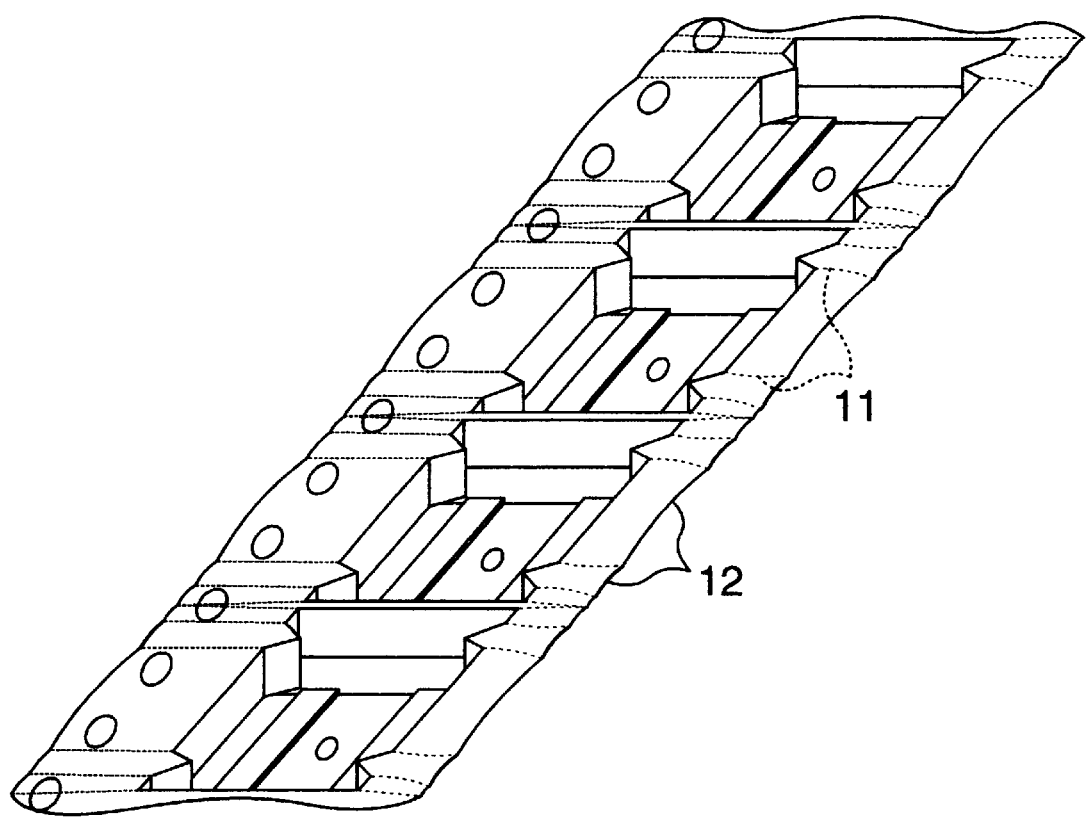

FIG. 13 schematically shows residual stress at molding and waving phenomenon of the flange portion in the carrier tape of Example 1.

Figure 14:
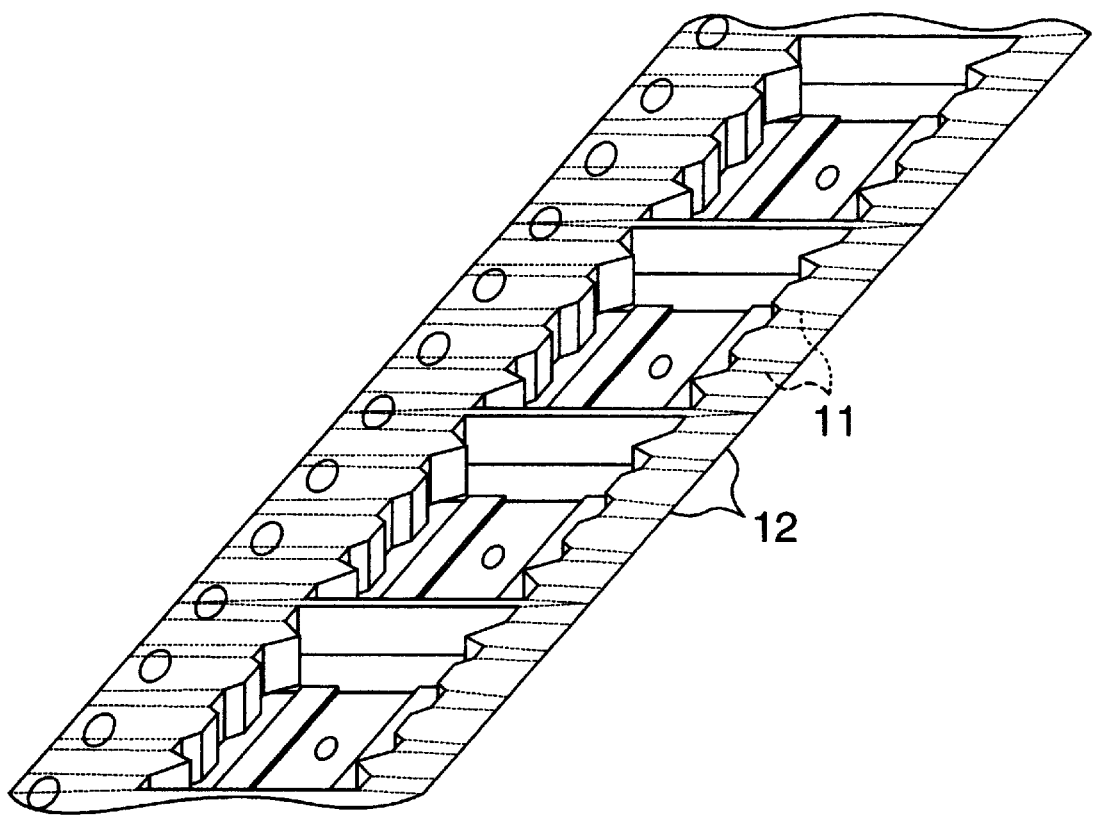

FIG. 14 schematically shows residual stress at molding and waving phenomenon of the flange portion in the carrier tape of Example 2.

The reference numerals and signs in FIG. 1 to FIG. 14 have the following meanings. 1: Carrier tape; 2: Recess (embossed portion); 3: Flange portion; 4: Perforations; 5: Reel; 6: Protrusion A; 7: Protrusion B; 8: Central protuberance; 9: Body of electronic component; 10: Lead part; 11: Residual stress trajectories; 12: Waviness in flange portion; 13: Cover tape; 14: Electronic component inserting section; 15: Electronic component-optically inspecting section; 16: Cover tape adhering section; s: Starting of insertion of electronic component; i: The first feeding; ii: The second feeding; iii: The third feeding; iv: The fourth feeding; v: The fifth feeding; IP: Insertion position of electronic component; x: The lengthwise direction of carrier tape for electronic components; e: Distance of ½ of length of electronic component in the direction perpendicular to the x direction; A—A: Distance between a pair of protrusions A (in the x direction) at the position thereof apart by the distance e from the center of the embossed portion; At—At: Distance between tops of protrusions A in the direction perpendicular to the x direction; Y: Distance between outermost sides of electronic component lead part; B–E: Difference between the shortest distance between two protrusions B in the direction perpendicular to the x direction and the length of electronic component in the direction perpendicular to the x direction; (At—At)—Y: Difference between At—At and Y.

According to the present invention, the body of the electronic component is prevented from transverse shaking by the protrusions A provided at a distance corresponding to the size of the electronic component to be stored in the embossed portion. Thus, lengthwise (x direction) movement of the electronic component is prevented during transportation to inhibit contact between the lead part and the side walls, thereby to prevent contamination and bending of the lead part and miss-recognition or miss-operation of inspection device at the time of inspection.

Furthermore, longitudinal shaking of the electronic component is prevented by a plurality of the protrusions B provided between the protrusions A. Thus, movement of the electronic component in the direction perpendicular to the lengthwise direction (x direction) is prevented during transportation to inhibit contact between the lead part and the side walls, thereby to prevent contamination and bending of the lead part.

Moreover, by providing the protrusions A and the protrusions B, the residual stress generated at the formation of the embossed portions in a flexible resin sheet can be dispersed and diminished.

Furthermore, the electronic component can be prevented from trembling during transportation by supporting the bottom portion of the electronic component by two or more central protuberances provided at the bottom of the embossed portion in the direction perpendicular to the lengthwise direction of the tape, and thus contamination and bending of the lead part can be prevented.

When an unexpected external force is applied to the electronic component from above, the central protuberances receive the external force at the bottom portion of the electronic component to reduce the force applied to the lead part, whereby the damage and distortion of the lead part can be minimized.

As explained above, the present invention has realized a carrier tape for electronic components which has the following advantages. That is, contamination, distortion and bending of the lead part of electronic component can be prevented; miss-recognition and miss-operation of inspection device for the electronic component are inhibited; scatter of peel strength at the time of peeling of the cover tape is diminished; and the tape is excellent in holding and protecting of electronic components, optical inspection ability for the inserted electronic components, and mounting operability in surface mounting.

Examples of the present invention will be explained in detail with reference to the accompanying drawings.

EXAMPLE 1

Figure 1:
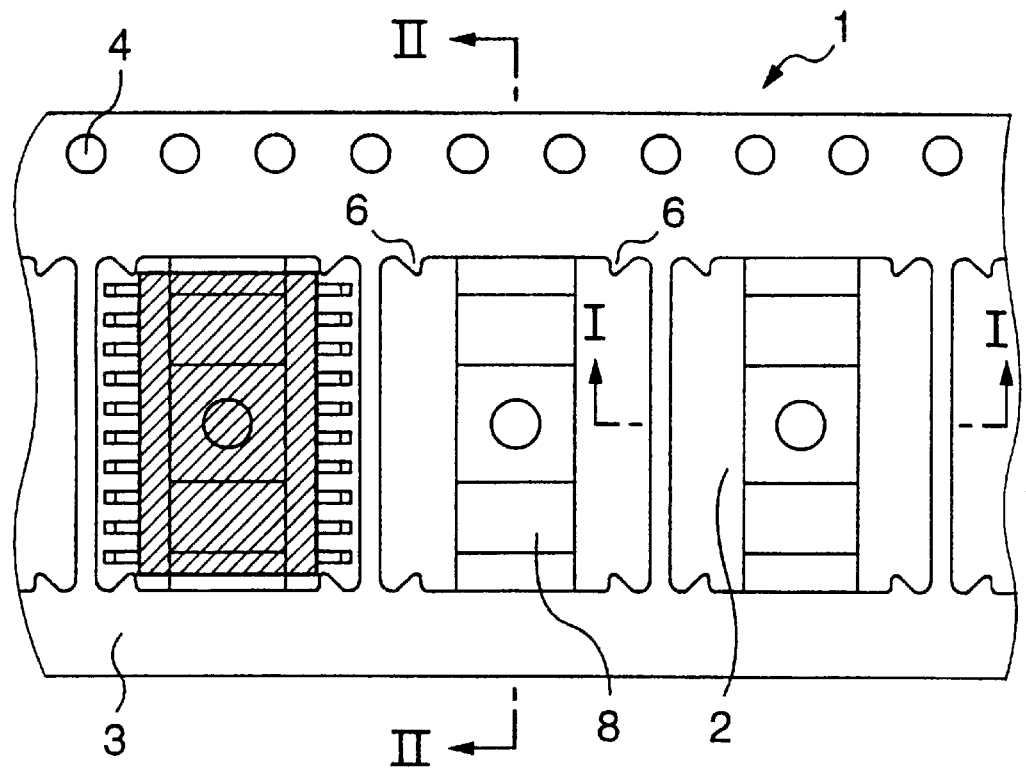
FIG. 1 is a plan view of the carrier tape of Example 1.
Figure 2:
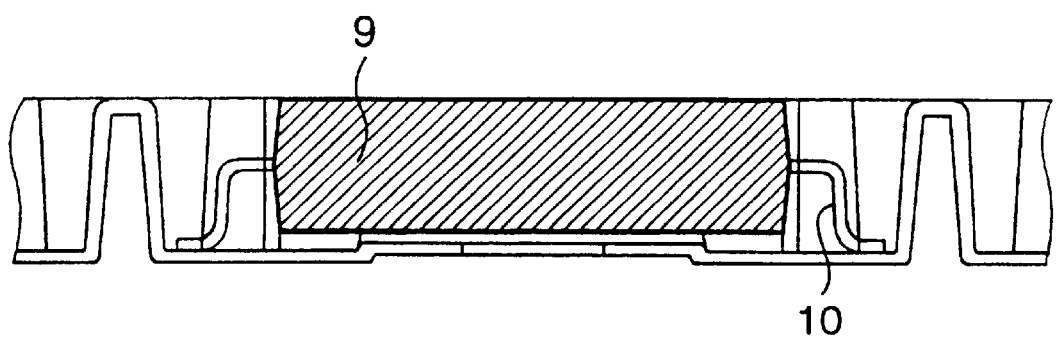
FIG. 2 is a lengthwise (I—I) sectional view of the carrier tape of Example 1 in FIG. 1.
Figure 3:
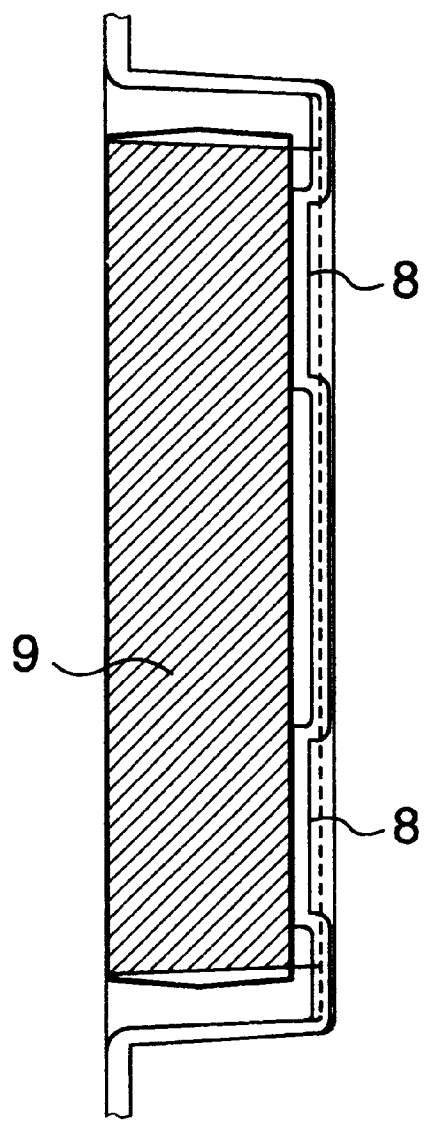
FIG. 3 is a sectional view of the carrier tape of Example 1 in FIG. 1 in the direction (II—II) perpendicular to the lengthwise direction of the tape.

FIGS. 1–3 show a carrier tape 1, in which embossed portions 2 are formed so that a plurality of IC packages such as SOP (Small Outline Package), SSOP (Shrink Small Outline Package), TSOP (Thin Small Outline Package), TSSOP (Thin Shrink Small Outline Package) and PLCC (Plastic Leaded Chip Carrier) can be stored therein. In this carrier tape 1, two protrusions A:6 are formed at the first and third side walls of the embossed portion 2 which are in the lengthwise direction of the tape, among the side walls of the embossed portion 2, and two central protuberances 8 are formed at the bottom of the embossed portion 2 in the direction perpendicular to the lengthwise direction of the tape.

Figure 4:
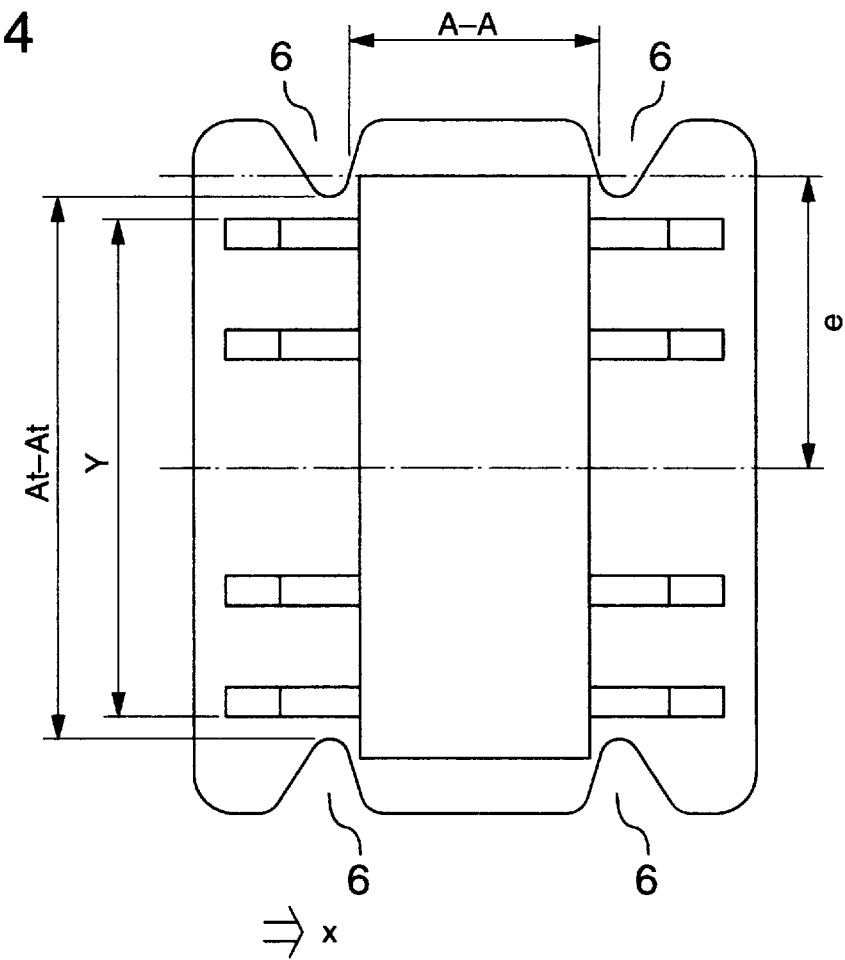
FIG. 4 is a partially enlarged view of the carrier tape of FIG. 1.

As shown in FIG. 4, the distance A—A between a pair of the protrusions A:6 is preferably larger by 0.05–0.5 mm than the length of the electronic component in the lengthwise direction of the tape, said distance being measured at the positions of the protrusions apart from the center of the embossed portion by the distance e which is ½ of the length of the electronic component in the direction perpendicular to the lengthwise direction of the carrier tape. If the difference in distance is less than 0.05 mm, there is the possibility that the electronic component cannot be inserted in the embossed portion 2 due to variation in the size. If it is more than 0.5 mm, the electronic component is apt to move owing to vibration.

Furthermore, as shown in FIG. 4, it is preferred that the distance At—At between the tops of the protrusions A:6 in the direction perpendicular to the lengthwise direction of the tape is larger by 0.05–2 mm than the distance Y between the outermost sides of the lead part of the electronic component. If the difference in distance is less than 0.05 mm, there is the possibility that the electronic component cannot be inserted in the embossed portion 2 due to variation in the size. If it is more than 2 mm, the electronic component is apt to move owing to vibration.

Furthermore, it is surface of the the wall surface of the protrusion A:6 which prevents transverse shaking of the electronic component, forms an angle of 3–45° with the direction perpendicular to the lengthwise direction of the tape. If the angle is smaller than 3°, the wall surface of the protrusion A:6 nearly contact with the surface of the body of the electronic component, and hence, insertion of the electronic component becomes difficult. If it is greater than 45°, it becomes difficult to prevent transverse shaking of the electronic component, and besides, scatter of residual stress generated by molding of the embossed portion becomes insufficient.

In the above construction, the protrusions A:6 prevent transverse shaking of the four corners of the electronic component 9 stored in the embossed portion 2, and even when a vibration is applied to the carrier tape 1 during transportation, the lead part 10 is held with keeping a certain space from the second and fourth side walls of the embossed portion 2 as shown in FIGS. 1–3.

Moreover, conventionally, in the formation of the embossed portion 2, the thickness of the central part of the bottom becomes greater, causing variation in bottom thickness. As a result, the bottom of the electronic component 9 is nearly supported at one point and trembling of the electronic component is often seen. However, when two central protuberances 8 are formed, the bottom of the electronic component 9 is supported at these two portions and trembling caused by vibration of the carrier tape 1 is diminished, whereby collision of the lead part 10 against the bottom of the embossed portion 2 can be avoided. In addition, when an unexpected external force acts on the electronic component 9, the external force does not directly act on the lead part 10, but acts on the body of the electronic component 9.

Conventionally, residual stress generated by the formation of the embossed portions 2 is concentrated to the corners of the embossed portions 2, resulting in great waviness of the flange portion 3 at intervals of the embossed portions as shown in FIG. 12. However, by providing a pair of protrusions A:6 at each of the first and third side walls of the embossed portion 2 which are positioned at both sides of the lengthwise direction of the carrier tape, the residual stress is also scattered to the portions of the protrusions A:6 and the waviness of the flange portion 3 is reduced as shown in FIG. 13.

EXAMPLE 2

Figure 7:
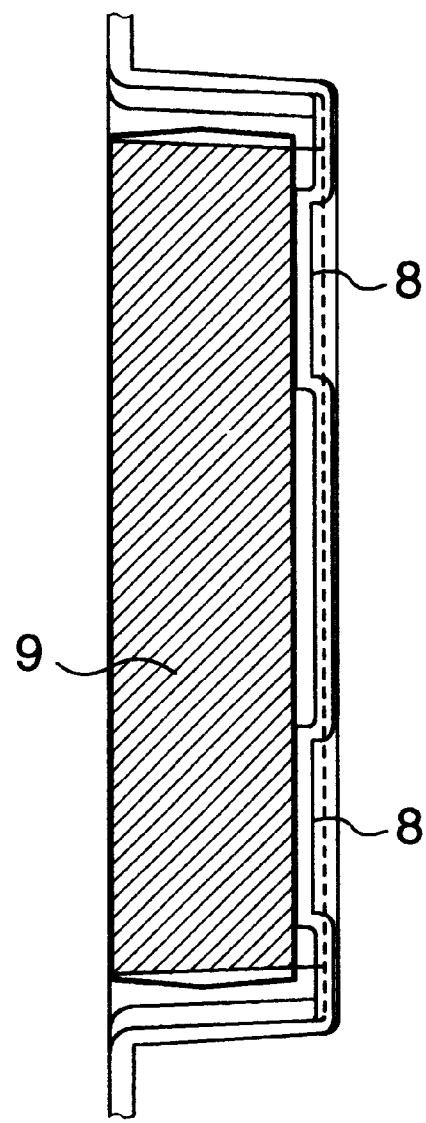
FIG. 7 is a sectional view of the carrier tape of Example 2 in FIG. 5 in the direction perpendicular to the lengthwise direction (IV—IV) of the tape.
Figure 5:
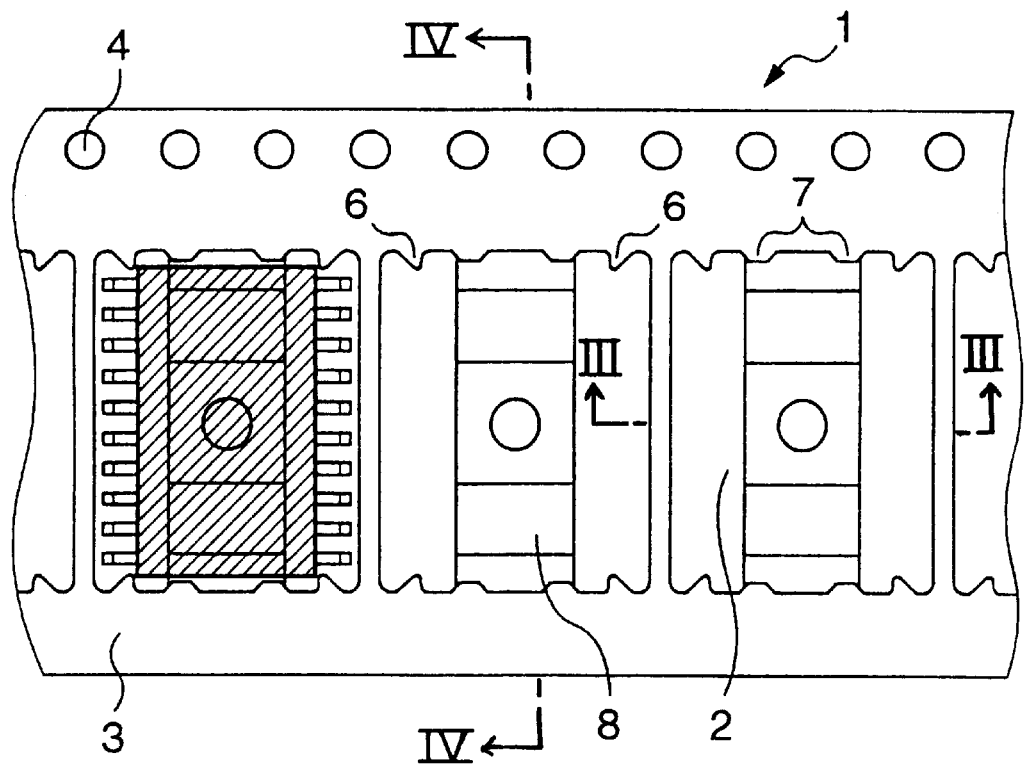
FIG. 5 is a plan view of the carrier tape of Example 2.
Figure 6:
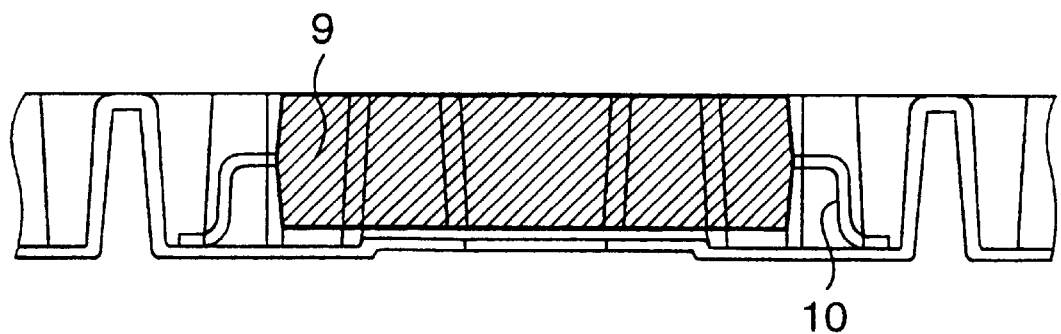
FIG. 6 is a lengthwise (III—III) sectional view of the carrier tape of Example 2 in FIG. 5.
Figure 9:
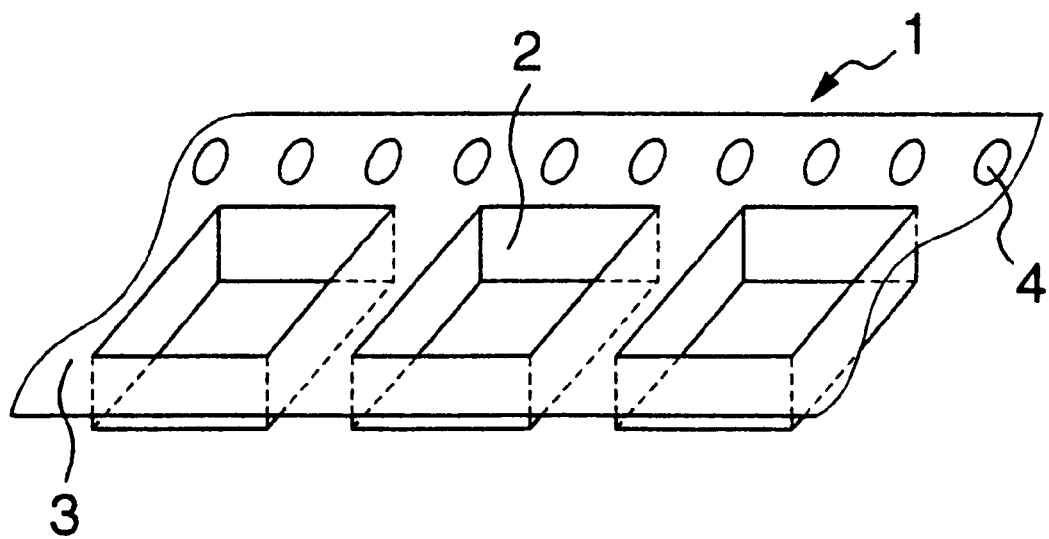
FIG. 9 is an oblique view of a conventional carrier tape for electronic components.
Figure 9:
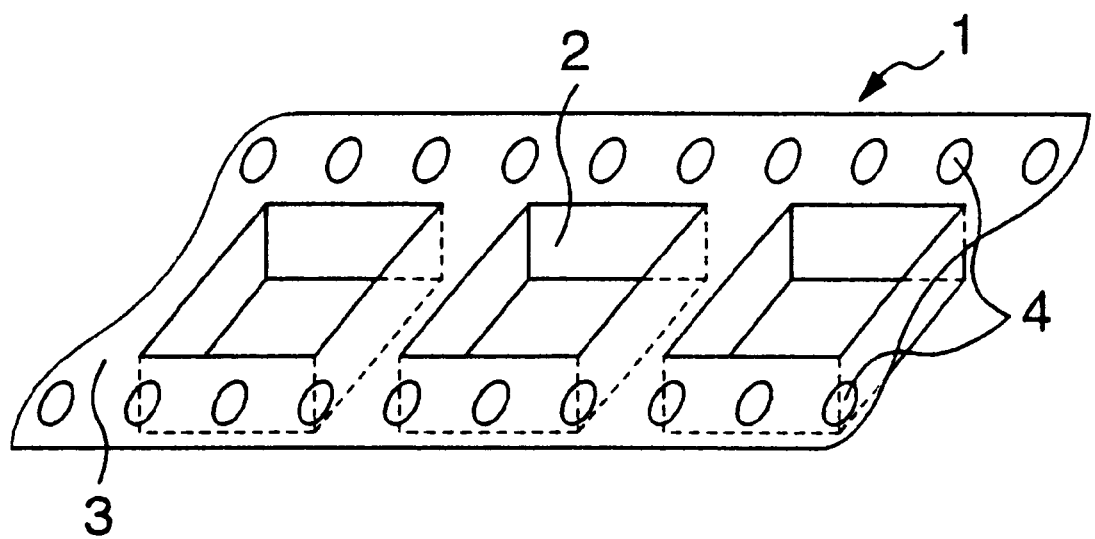
Figure 10:
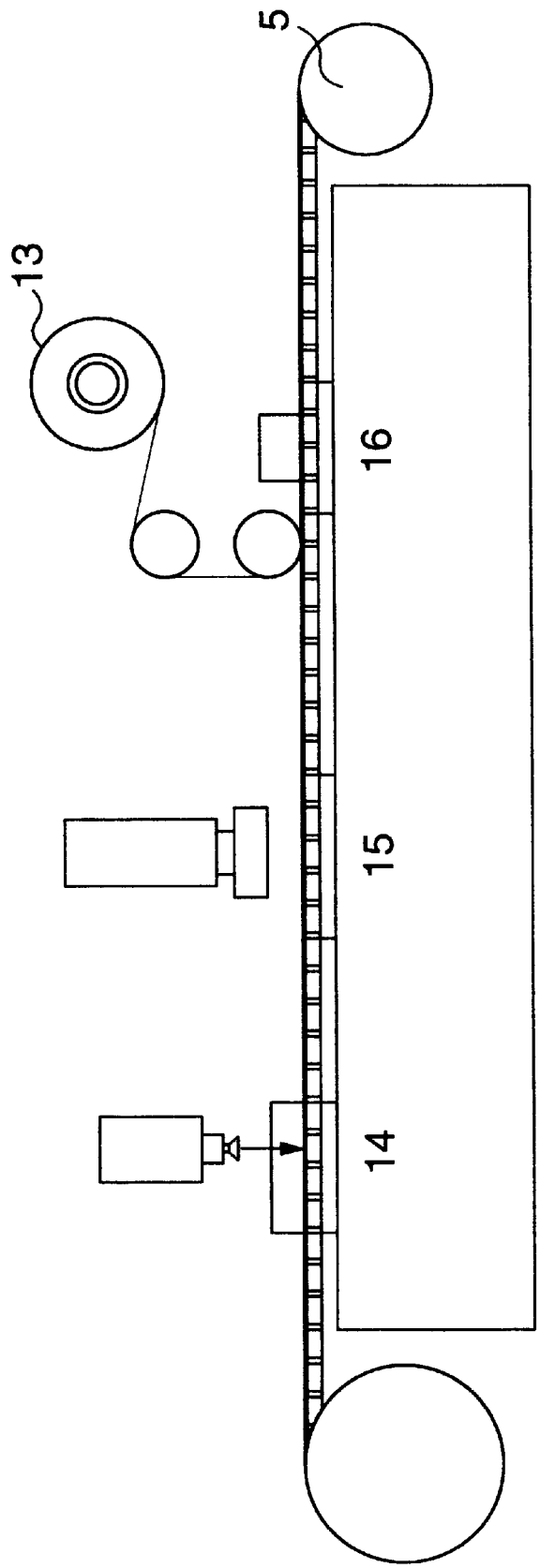
FIG. 10 is a diagram which shows the steps of insertion of electronic components, optical inspection of the electronic components and adhesion of a cover tape in using a carrier tape.
Figure 11:
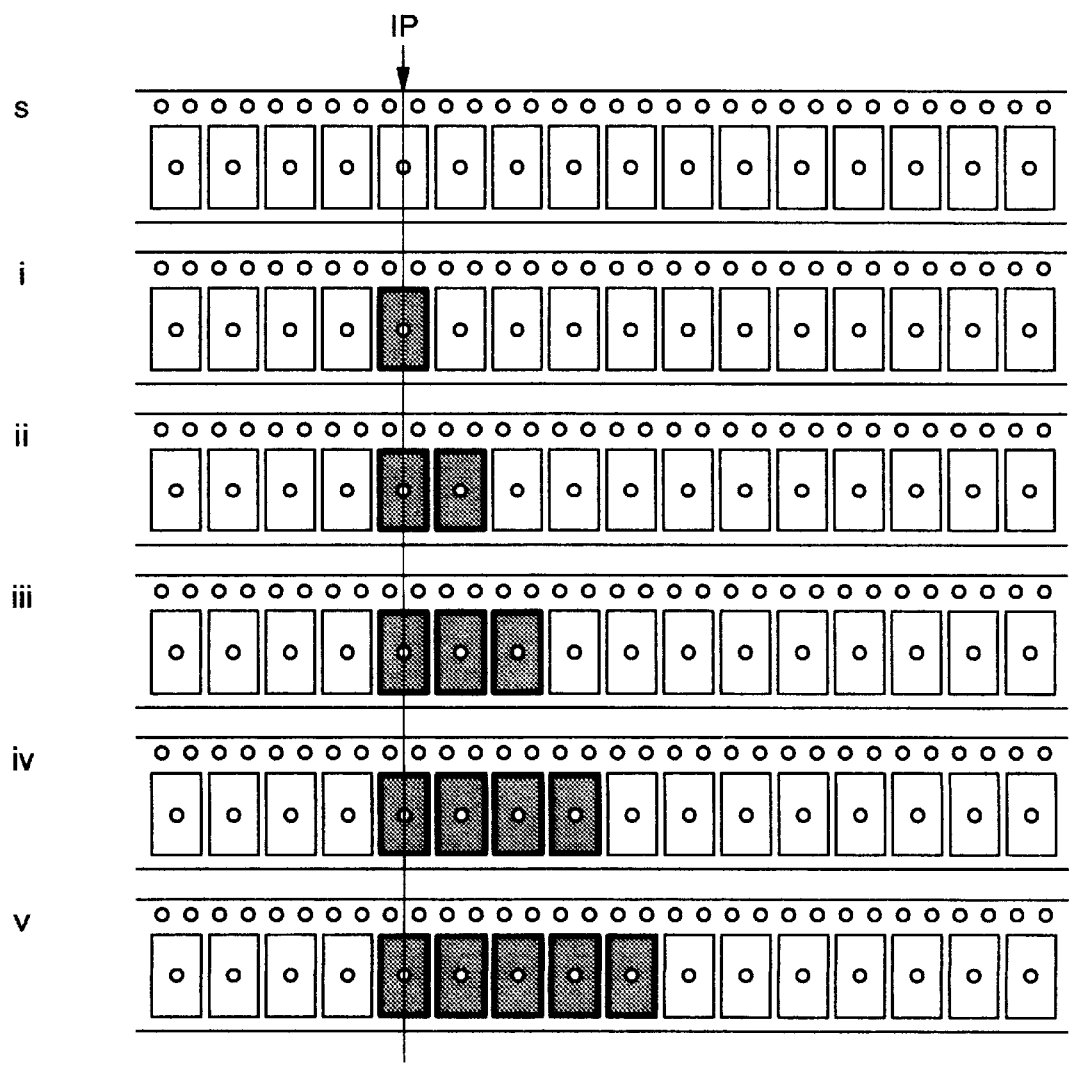
FIG. 11 is a diagram of intermittent feeding of the carrier tape for electronic components.

The carrier tape in this Example is the same as that in Example 1, except that two protrusions B:7 are formed between the protrusions A:6 provided at the first and third side walls of the embossed portion 2 which are positioned in the lengthwise direction of the tape among the side walls of the embossed portion 2 as shown in FIGS. 5–7. The protrusions B:7 do not protrude beyond the protrusions A:6 in the direction perpendicular to the lengthwise direction of the carrier tape and are formed so as to prevent longitudinal shaking of the end faces of the body of the electronic component 9.

It is preferred that the shortest distance (B) between two protrusions B:7 in the direction perpendicular to the lengthwise direction of the carrier tape is larger by 0.1–1 mm than the length (E) of the electronic component in the direction perpendicular to the lengthwise direction of the carrier tape. If the difference in distance is less than 0.1 mm, sometimes, the electronic component cannot be inserted in the embossed portion 2 due to variation in the size. If it is more than 1 mm, the electronic component is apt to move by the vibration and further, the electronic component is apt to turn in the embossed portion.

Figure 8:
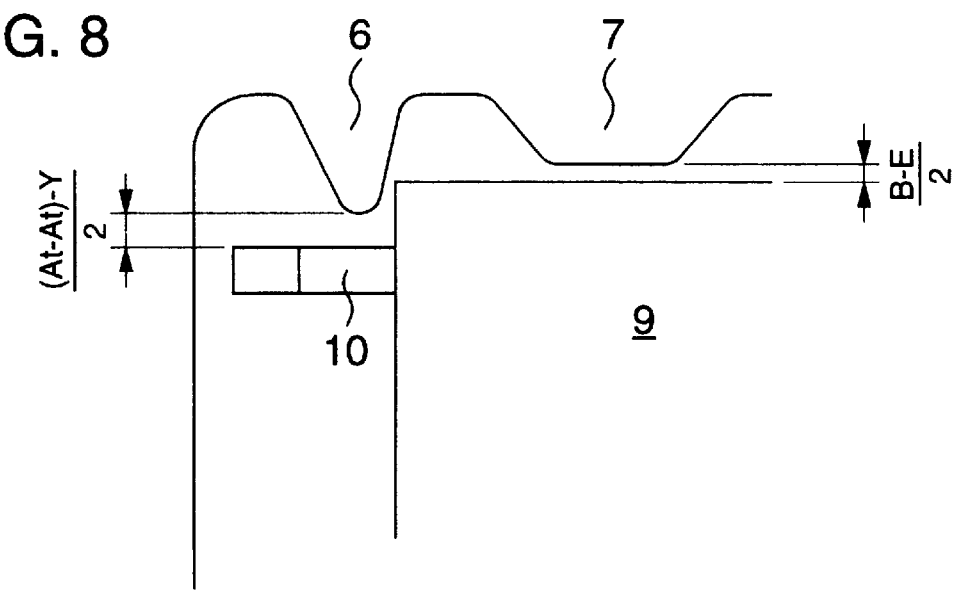
FIG. 8 is a partially enlarged view of the carrier tape of FIG. 5.

Moreover, as for the protrusions B:7, it is preferred that the difference of B (the shortest distance)—the length of the electronic component (E) is smaller than the difference [(At—At)—Y] between the distance between the tops of the protrusions A (At—At in FIG. 4) and the distance (Y in FIG. 4) between the outermost sides of the lead part of the electronic component as shown in FIG. 8. If B–E is larger than (At—At)—Y, the lead part readily contacts with the protrusions A to suffer from contamination.

In the above construction, as shown in FIG. 5, the protrusions A:6 prevent transverse shaking of the four corners of the electronic component 9 stored in the embossed portion 2, and, besides, the protrusions B:7 prevent longitudinal shaking of the body per se of the electronic component 9. Thus, as compared with the case where no protrusions B:7 are provided, the electronic component 9 is inhibited from turning horizontally and the electronic component 9 is stably held, even when vibration is applied to the carrier tape 1 during transportation.

Moreover, by the formation of the additional protrusions B:7 at the first and third side walls of the embossed portion 2 which are positioned at both sides of the lengthwise direction of the carrier tape, the residual stress generated by the formation of the embossed portions 2 is further scattered by the protrusions B:7 and the waviness of the flange portion 3 is further diminished as shown in FIG. 14.

What is claimed is:

1. A carrier tape for electronic components comprising a flexible tape material having embossed portions for storing electronic components at regular intervals in the lengthwise direction of the tape, characterized in that the opposing first and third side walls of the embossed portion which are in the lengthwise direction of the tape, respectively have a pair of protrusions (A) for inhibiting an electronic component from transverse shaking, which protrude inwardly in the embossed portion, wherein the distance between a pair of the protrusions (A), so dimensioned on one side wall, is larger by 0.05–0.5 mm than the length of the electronic component in the lengthwise direction of the carrier tape, said distance between the pair of the protrusions (A) being measured at the position thereof apart from the center of the embossed portion by the distance of ½ of the length of the electronic component in the direction perpendicular to the lengthwise direction of the tape; the wall surface forming the protrusions (A) which inhibit transverse shaking of the electronic component, forms an angle of 3–45° with the direction perpendicular to the lengthwise direction of the tape; and the distance between the tops of the protrusions (A) in the direction perpendicular to the lengthwise direction of the tape is larger by 0.05–2 mm than the distance between the outermost sides of the outer lead parts on one side of the electronic component.

2. A carrier tape for electronic components comprising a flexible tape material having embossed portions for storing electronic components at regular intervals in the lengthwise direction of the tape, characterized in that the opposing first and third side walls of the embossed portion which are in the lengthwise direction of the tape, respectively have a pair of first protrusions (A) for inhibiting an electronic component from transverse shaking, which protrude inwardly in the embossed portion, and further have, between the first protrusions (A), a plurality of second protrusions (B) for preventing the electronic component from longitudinal shaking which differ in shape from the first protrusions (A).

3. A carrier tape for electronic components according to claim 2, wherein the difference between the shortest distance between two second protrusions (B), so dimensioned in the direction perpendicular to the lengthwise direction of the carrier tape, and the length of the electronic component in the direction perpendicular to the lengthwise direction of the tape is 0.1–1 mm and is smaller than the difference between the distance between the tops of the first protrusions (A), so dimensioned on one side wall in the direction perpendicular to the lengthwise direction of the tapes and the distance between the outermost sides of the outer lead parts on one side of the electronic component.

4. A carrier tape for electronic components according to claim 2, wherein the bottom surface forming the embossed portion has two or more central protuberances in the direction perpendicular to the lengthwise direction of the carrier tape.

* * * * *